United States Patent  (10) Patent No.: US 8,962,474 B2
Yu et al.  (45) Date of Patent: Feb. 24, 2015

(54) METHOD FOR FORMING AN AIR GAP AROUND A THROUGH-SILICON VIA

(75) Inventors: Hong Yu, Singapore (SG); Huang Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 489 days.

(21) Appl. No.: 13/290,791

(22) Filed: Nov. 7, 2011

(65) Prior Publication Data

US 2013/0115769 A1 May 9, 2013

(51) Int. Cl.
*H01L 21/4763* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 21/7682* (2013.01)
USPC ............................ 438/637; 438/667; 257/774

(58) Field of Classification Search
CPC .................. H01L 21/76898; H01L 21/76877; H01L 21/7682; H01L 23/481
USPC .......... 438/667, 637, 653, 675, 700; 257/508, 257/E23.011, E21.573, E21.575, E21.597, 257/E23.067, 774, E21.585, E23.174
See application file for complete search history.

(56) References Cited

U.S. PATENT DOCUMENTS

| 7,402,515 | B2 | 7/2008 | Arana et al. | |
| 7,666,768 | B2 | 2/2010 | Raravikar et al. | |
| 2006/0003541 | A1* | 1/2006 | Choi et al. | 438/424 |
| 2006/0290002 | A1* | 12/2006 | Arana et al. | 257/774 |
| 2007/0105336 | A1* | 5/2007 | Takeoka et al. | 438/424 |
| 2008/0164573 | A1* | 7/2008 | Basker et al. | 257/621 |
| 2009/0127667 | A1* | 5/2009 | Iwata | 257/621 |
| 2012/0217611 | A1* | 8/2012 | Liu et al. | 257/508 |

OTHER PUBLICATIONS

A. Mercha et al., "Comprehensive Analysis of the Impact of Single and Arrays of Through Silicon Vias Induced Stress on High-k / Metal Gate CMOS Performance," IEEE, 2010, pp. 2.2.1-2.2.4.

* cited by examiner

*Primary Examiner* — Khiem D Nguyen
(74) *Attorney, Agent, or Firm* — Ditthavong & Steiner, P.C.

(57) ABSTRACT

Semiconductor devices with air gaps around the through-silicon via are formed. Embodiments include forming a first cavity in a substrate, filling the first cavity with a sacrificial material, forming a second cavity in the substrate, through the sacrificial material, by removing a portion of the sacrificial material and a portion of the substrate below the sacrificial material, filling the second cavity with a conductive material, removing a remaining portion of the sacrificial material to form an air gap between the conductive material and the substrate, and forming a cap over the air gap.

8 Claims, 14 Drawing Sheets

METHOD FOR FORMING AN AIR GAP AROUND A THROUGH-SILICON VIA

TECHNICAL FIELD

The present disclosure relates to a method of fabricating semiconductor devices with through-silicon vias. The present disclosure is particularly applicable to fabricating semiconductor devices with an air gap surrounding a through-silicon via.

BACKGROUND

The integration of hundreds of millions of circuit elements, such as transistors, on a single integrated circuit necessitates further scaling down or micro-miniaturization of the physical dimensions of circuit elements, including interconnection structures. Micro-miniaturization has engendered a dramatic increase in transistor engineering complexity, resulting in several problems.

One such problem is stresses formed between copper through-silicon vias (TSVs) and silicon substrates as a result of the difference between the coefficients of thermal expansion (CTE) of copper and silicon. For example, copper has a CTE of 16.5; whereas silicon has a CTE of 2.6. This CTE mismatch may cause significant stress in the silicon and copper. As a result of the micro-miniaturization, when the TSVs are close together, the stress fields caused by the difference in CTE interact, further magnifying the stress. This stress causes numerous problems, including thin-film delamination, cracking, and the degradation of transistor performance over time.

A need therefore exists for methodology enabling formation of air gaps around TSVs, and the resulting device.

SUMMARY

An aspect of the present disclosure is an efficient method of fabricating a semiconductor device with an air gap around a through-silicon via.

Another aspect of the present disclosure is a semiconductor device including an air gap between a through-silicon via and the substrate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first cavity in a substrate, filling the first cavity with a sacrificial material, forming a second cavity in the substrate, through the sacrificial material, by removing a portion of the sacrificial material and a portion of the substrate below the sacrificial material, filling the second cavity with a conductive material, removing a remaining portion of the sacrificial material to form an air gap between the conductive material and the substrate, and forming a cap over the air gap.

Aspects of the present disclosure include lining the first cavity with an oxide material prior to filling the first cavity with the sacrificial material, and forming the second cavity through the sacrificial material and the oxide material. Further aspects include forming a photoresist over the substrate and the sacrificial material, patterning the photoresist, and removing the photoresist over the portion of the sacrificial material, prior to forming the second cavity. Another aspect includes forming a protective oxide layer over the sacrificial material prior to forming the photoresist. An additional aspect includes removing the protective oxide layer prior to removing the remaining portion of the sacrificial material. Yet an additional aspect includes lining the second cavity with an oxide material prior to filling the second cavity with the conductive material, wherein the air gap is formed between the substrate and the oxide material. Another aspect includes lining the second cavity with a liner material after lining the second cavity with the oxide material and prior to filling the cavity with the conductive material. A further aspect includes removing a bottom portion of the substrate to expose the conductive material.

Another aspect of the present disclosure includes a method including: forming at least one first cavity in a substrate, conformally depositing an oxide material over the substrate and lining the first cavity, filling the oxide-lined first cavity with a polymer material, forming an oxide protection layer over the polymer material and the substrate, forming a second cavity through the oxide protection layer, the polymer material, and a portion of the substrate, the second cavity having a diameter smaller than a diameter of the first cavity, conformally depositing an isolation material followed by a conductive liner material over the substrate and lining the second cavity, filling the lined cavity with a conductive material, polishing the conductive material, the liner material, the oxide protection layer, and the oxide material down to an upper surface of the substrate, removing a remaining portion of the polymer material to form an air gap between the isolation material and the oxide material, and forming a cap over the air gap.

Another aspect of the present disclosure is a device including: a substrate, a conductive material extending into the substrate, an air gap extending into the substrate, between at least part of the conductive material and the substrate, and a cap over the air gap.

Aspects include a device including an oxide layer between the air gap and the substrate. Another aspect includes an oxide layer between the air gap and the conductive material. Further aspects include a liner material layer between the oxide layer and the conductive material. An additional aspect includes the conductive material extending farther into the substrate than the air gap. A further aspect includes the air gap entirely surrounding the conductive material for at least a portion of the depth of the conductive material. An aspect also includes a nitride layer over the substrate. An additional aspect includes having the cap over the air gap be coplanar with the nitride layer over the substrate. Further aspects include the conductive material extending into the substrate to a depth of 500 nm to 50 μm. A further aspect includes the conductive material forming, at least in part, a through-silicon via having a diameter of 5 μm to 50 μm. An additional aspect includes at least one transistor on the substrate, with each transistor spaced at least 1 μm from the through-silicon via.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIGS. 1 through 14 schematically illustrate air gap process steps and a resulting through-silicon via with an air gap, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of significant stress resulting from the difference between the CTE of copper and the CTE of silicon attendant upon forming TSVs in semiconductor devices. In accordance with embodiments of the present disclosure, an air gap is formed around a TSV, between the silicon substrate and the copper TSV.

Methodology in accordance with embodiments of the present disclosure includes forming at least one first cavity in a substrate, and conformally depositing an oxide material over the substrate to line the first cavity. The oxide-lined first cavity is then filled with a polymer material, and an oxide protection layer is formed over the polymer material and the substrate to protect the polymer material from subsequent processing. Next, a second cavity, having a diameter that is smaller than a diameter of the first cavity, is formed through the oxide protection layer, the polymer material, and a portion of the substrate. Then, an isolation material and a conductive liner material are each conformally deposited over the substrate to line the second cavity. Subsequently, the second cavity is filled with a conductive material followed by polishing the conductive material, the liner material, the oxide protection layer, and the oxide material down to an upper surface of the substrate. The remaining portion of the polymer material is then removed to form an air gap between the isolation material and the oxide material, and a capping layer is deposited over the air gap.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
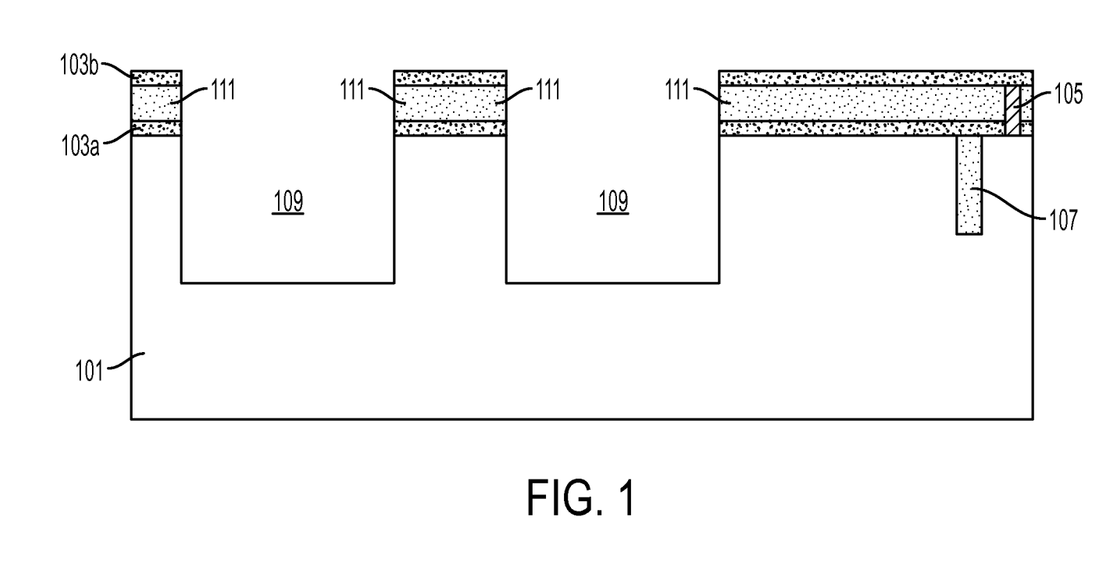

Adverting to FIG. 1, a method for forming a semiconductor, in accordance with an exemplary embodiment, begins with conventional semiconductor processing of substrate 101, which includes formation of one or more shallow trench isolation (STI) regions 107 within the substrate 101, a nitride layer 103a over the substrate 101 and above STI regions 107, an oxide layer 111 over nitride layer 103a, at least one contact 105 through oxide layer 111 and nitride layer 103a, and a nitride layer 103b over oxide layer 111 and contact 105. Each of the nitride layers 103a and 103b may be formed to a thickness of 300 Å to 800 Å. The method, in accordance with an exemplary embodiment begins by forming a first cavity 109 in substrate 101, for example to a diameter of 5 microns (μm) to 50 μm and to a depth of 500 nanometers (nm) to 20 μm. Although FIG. 1 illustrates two first cavities 109, any number of cavities may be formed in the substrate 101 in accordance with the required number of TSVs for the particular application. For convenience, the remainder of the specification will refer to one first cavity 109.

Figure 2:
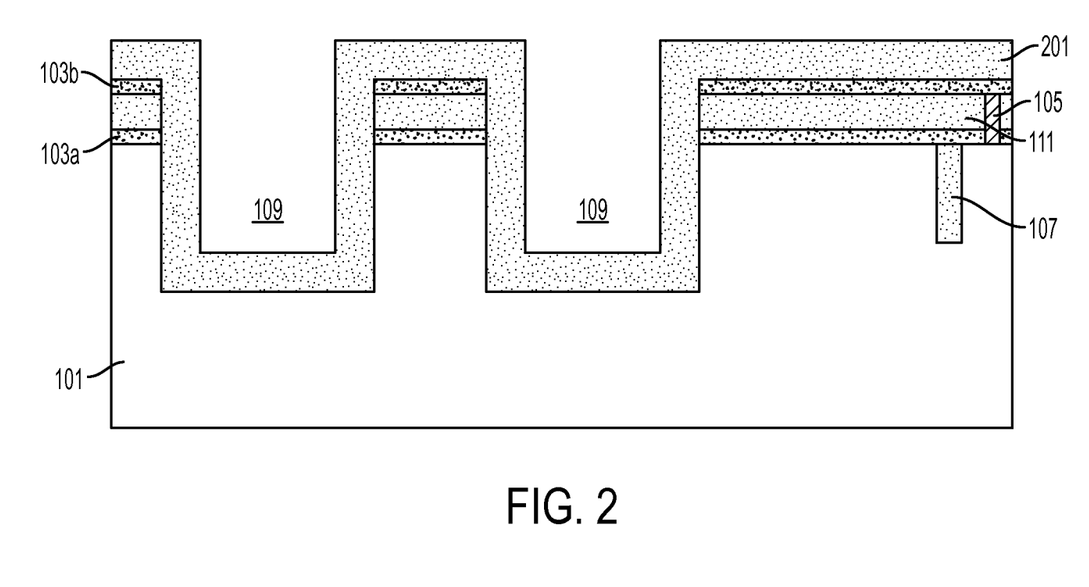

Adverting to FIG. 2, an oxide layer 201 is conformally formed over the substrate 101 to line the sidewalls and bottom of the first cavity 109. The oxide layer 201 may be formed to a thickness of 200 Å to 2000 Å. The oxide layer 201 may be formed of the same oxide material as used for oxide layer 111, for example, a tetraethylorthosilicate (TEOS; $Si(OC_2H_5)_4$), a high density plasma (HDP) oxide, or a high-aspect-ratio-process (HARP) oxide.

Figure 3:
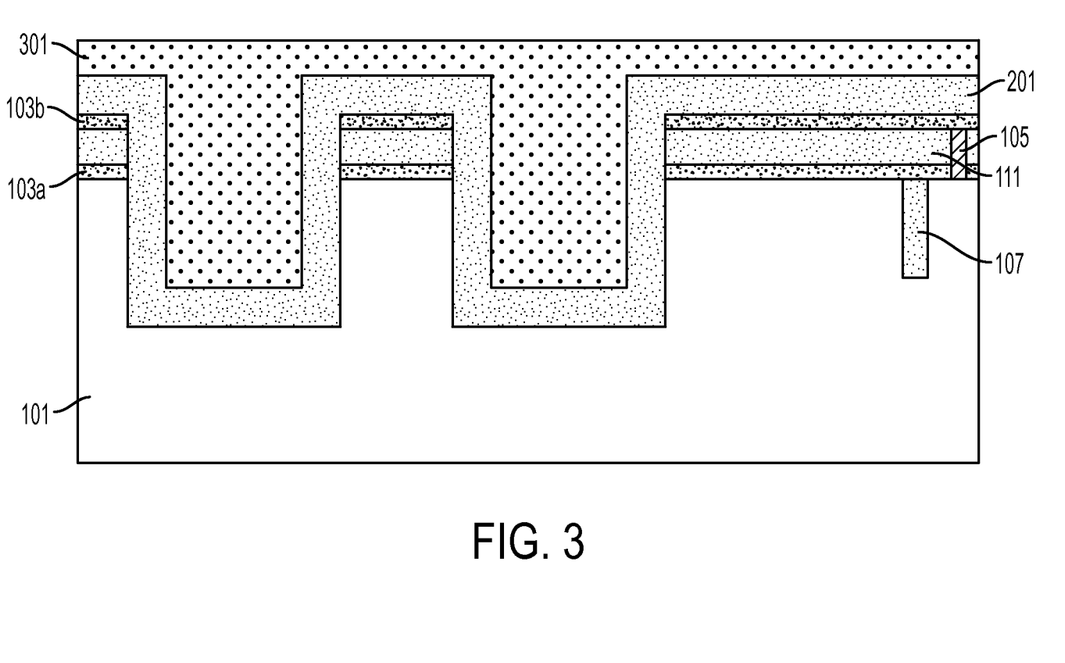

Next, a sacrificial material 301 is deposited over the substrate 101 to fill the first cavity 109, as illustrated in FIG. 3. The sacrificial material 301 may be any type of polymer-based sacrificial material, for example photoresist based on poly(methyl methacrylate) (PMMA), polyimide, or polydimethylglutarimide (PMGI). The sacrificial material may alternatively be formed of other polymeric materials, which have been used as organic planarization material. The sacrificial material may be a combination of organic and inorganic material. The sacrificial material may be deposited by, for example, spin-coating or other techniques. The sacrificial material may also be carbon-based, such as plasma deposited amorphous carbon or sputtered carbon.

Figure 4:
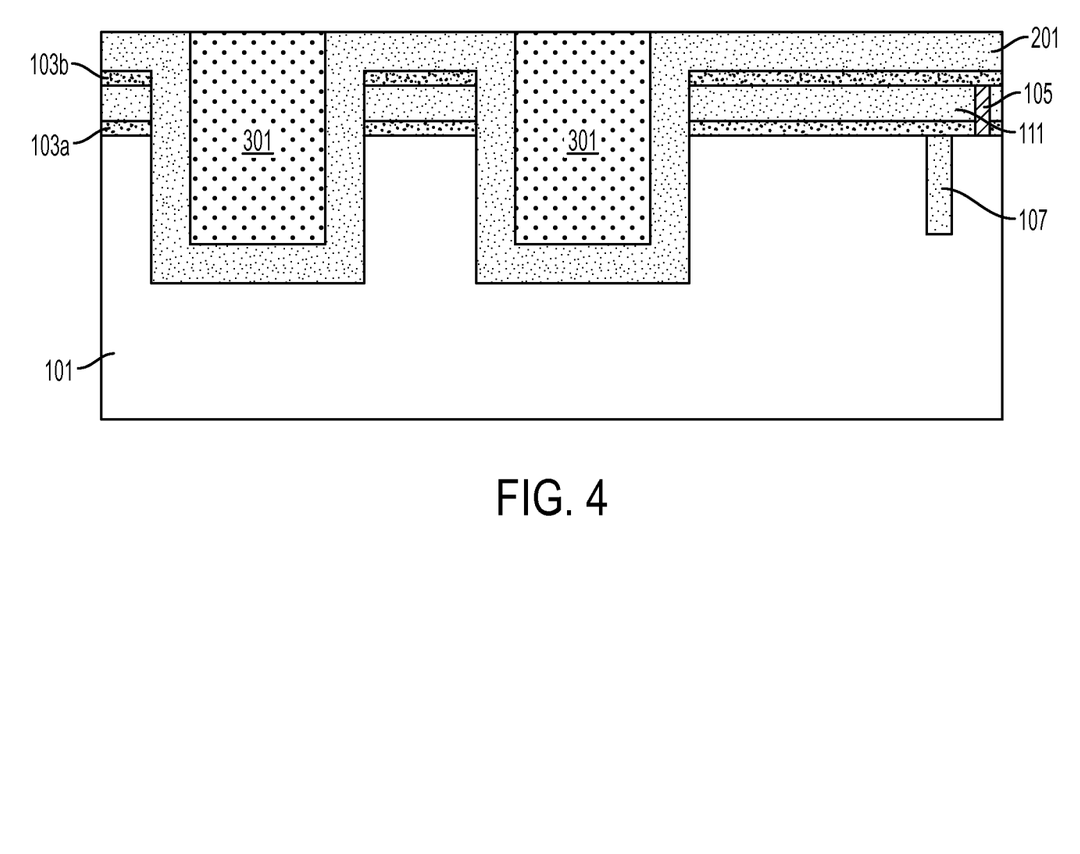

Adverting to FIG. 4, a portion of the sacrificial material 301 is removed, leaving the top surface of the filled cavity co-planar with the oxide layer 201. The sacrificial material 301 may be removed via an etch process or by chemical mechanical polishing (CMP), stopping on the oxide layer 201.

Figure 5:
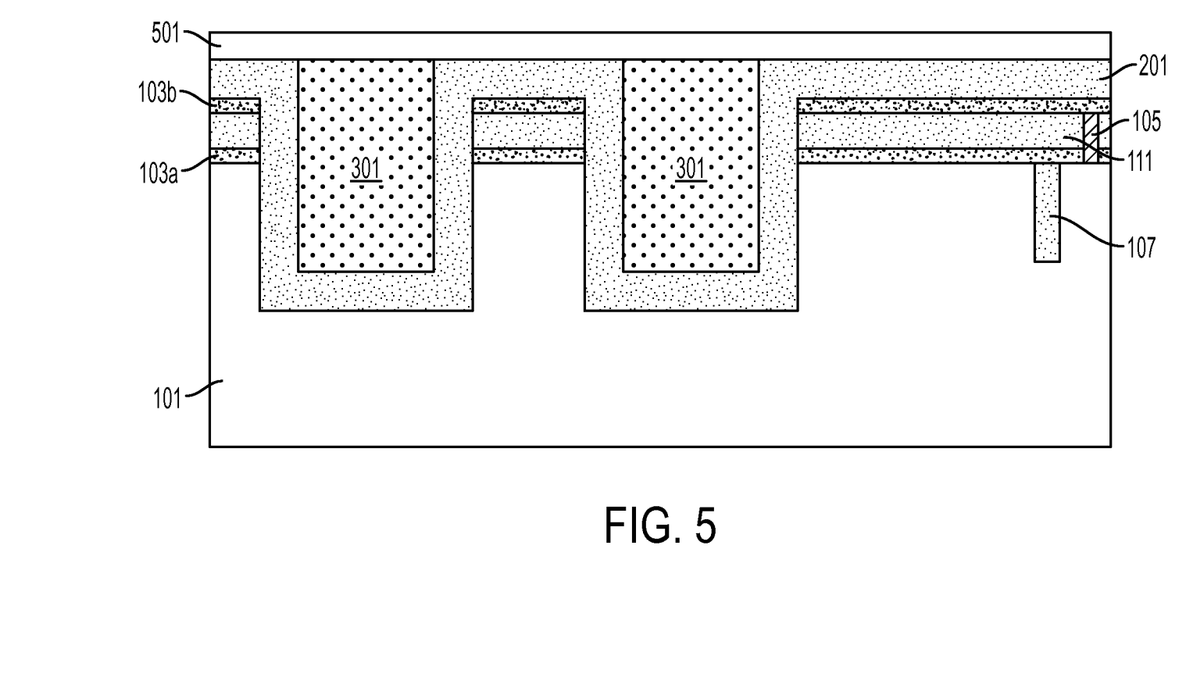

As illustrated in FIG. 5, a protective oxide layer 501 is formed over the sacrificial material 301 and oxide layer 201 to protect the sacrificial material from subsequent processing. The protective oxide layer 501 may be the same material as oxide layer 201 or may be formed of another type of oxide.

Figure 6:
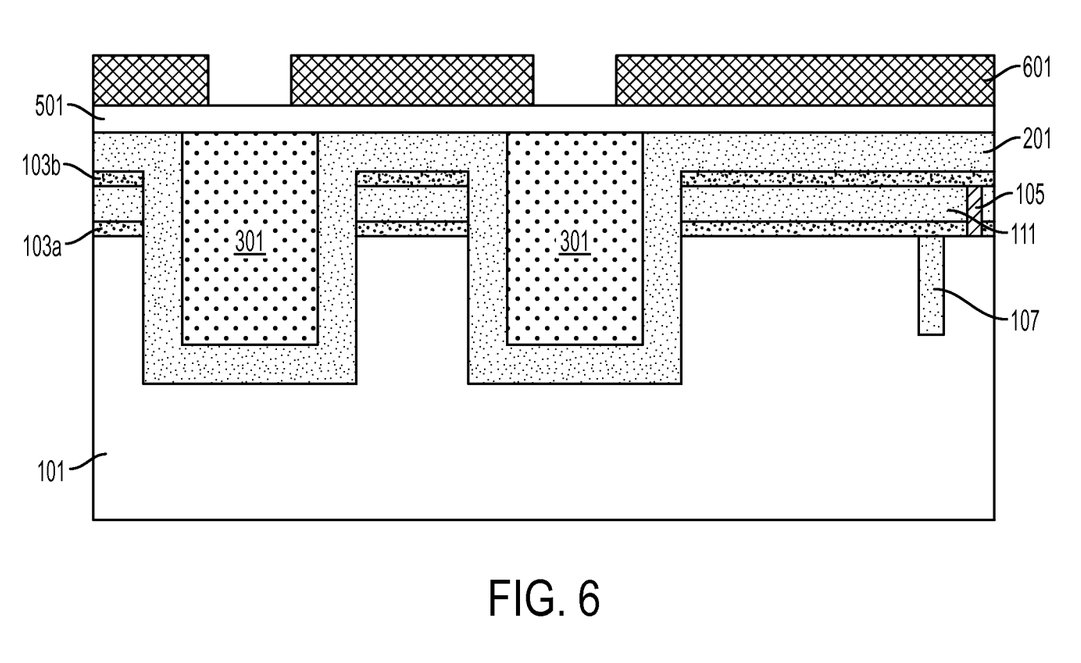

Adverting to FIG. 6, a photoresist 601 is formed over the protective oxide layer 501. Photoresist 601 is patterned to form an opening over a portion of the sacrificial material 301 that will correspond to the location of the TSV. Lithography may, for example, be used to pattern the photoresist 601.

Figure 7:
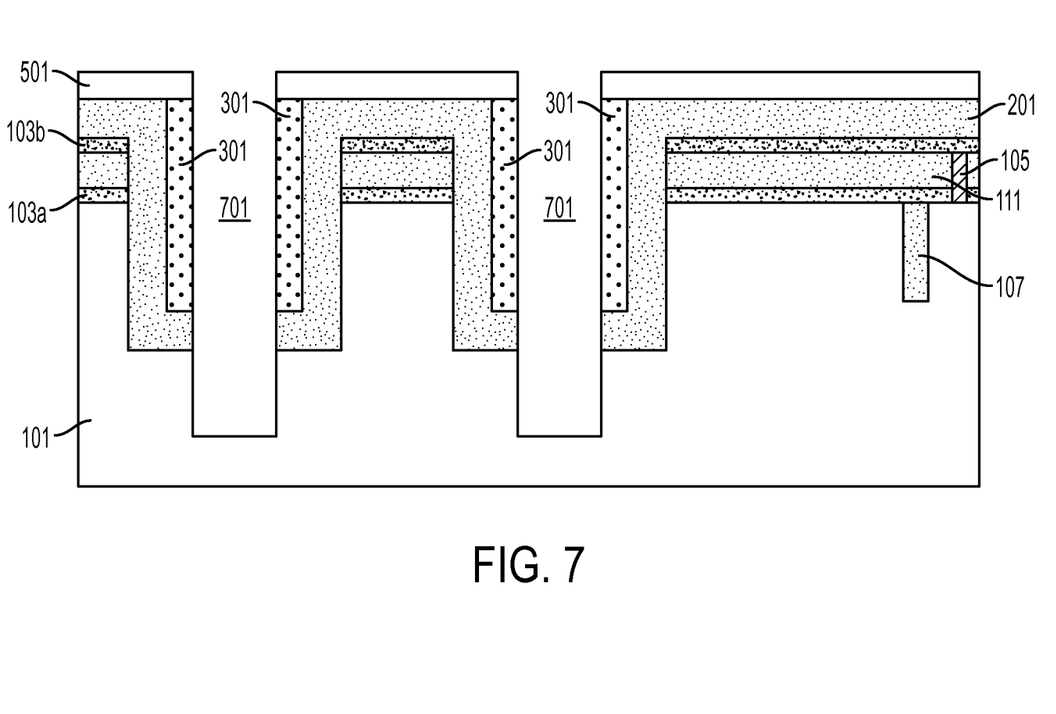

As shown in FIG. 7, a second cavity 701 is formed in the substrate 101, through protective oxide layer 501, sacrificial material 301, and oxide layer 201. Reactive ion etching (RIE) dry etch may, for example, be used to remove the various materials/layers, followed by a cleaning step to remove any residue and particles. The diameter of the second cavity 701 is smaller than the diameter of the first cavity 109, and is, for example, from 1 μm to 20 μm. In addition, the depth of the second cavity 701 is deeper than the depth of the first cavity 109, and is, for example, from 20 μm to 500 μm.

Figure 8:
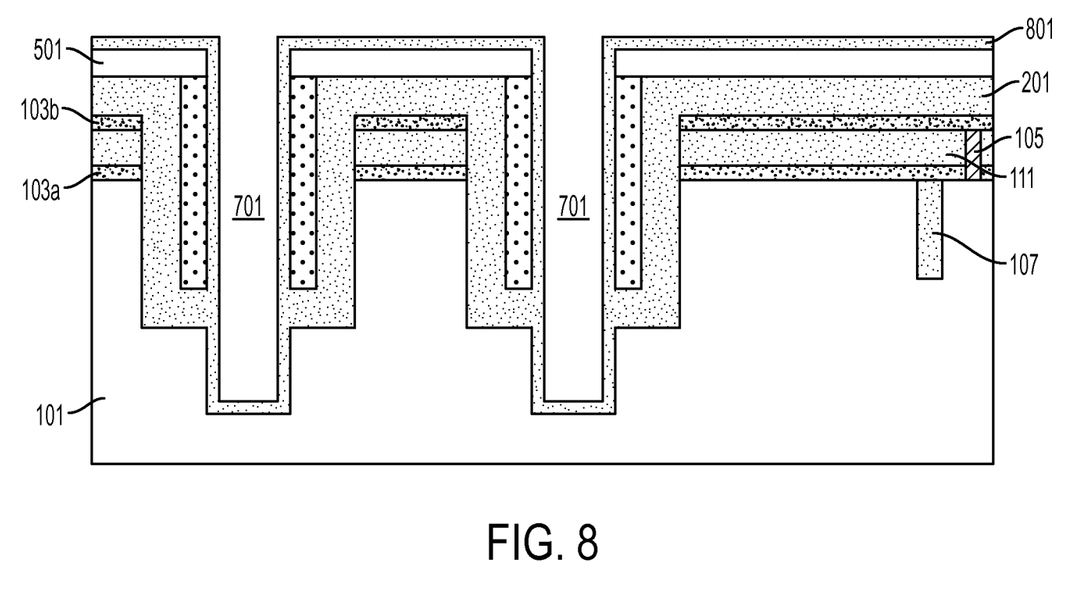

Adverting to FIG. 8, an oxide layer 801 is conformally formed over the substrate 101 to line the sidewalls and bottom of the second cavity 701. The oxide layer 801 may be the same material as the oxide layer 201, and may be formed to a thickness of 100 Å to 3000 Å. The thickness, however, may vary depending on the diameter of the TSV.

Figure 9:
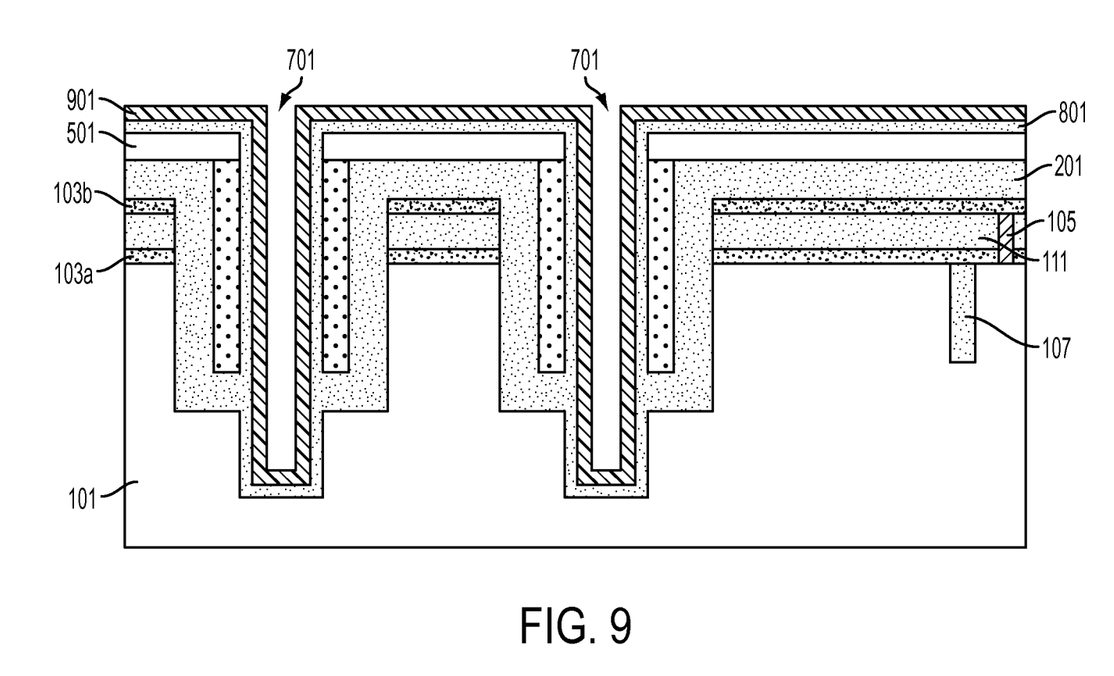

A conductive liner 901 is then conformally formed over the substrate 101 to line the sidewalls and bottom of the second cavity 701 over the oxide layer 801, as illustrated in FIG. 9. The conductive liner 901 may be, for example, tantalum/tantalum nitride (Ta/TaN), titanium/titanium nitride (Ti/TiN), tungsten/tungsten nitride (W/WN), or ruthenium (Ru). The conductive liner 901 may be formed to a thickness of 100 Å to 3000 Å, depending on the size of the TSV. For example, for a TSV with a diameter of 5 μm, the conductive liner 901 may be formed to a thickness of 500 Å to 3000 Å.

Figure 10:
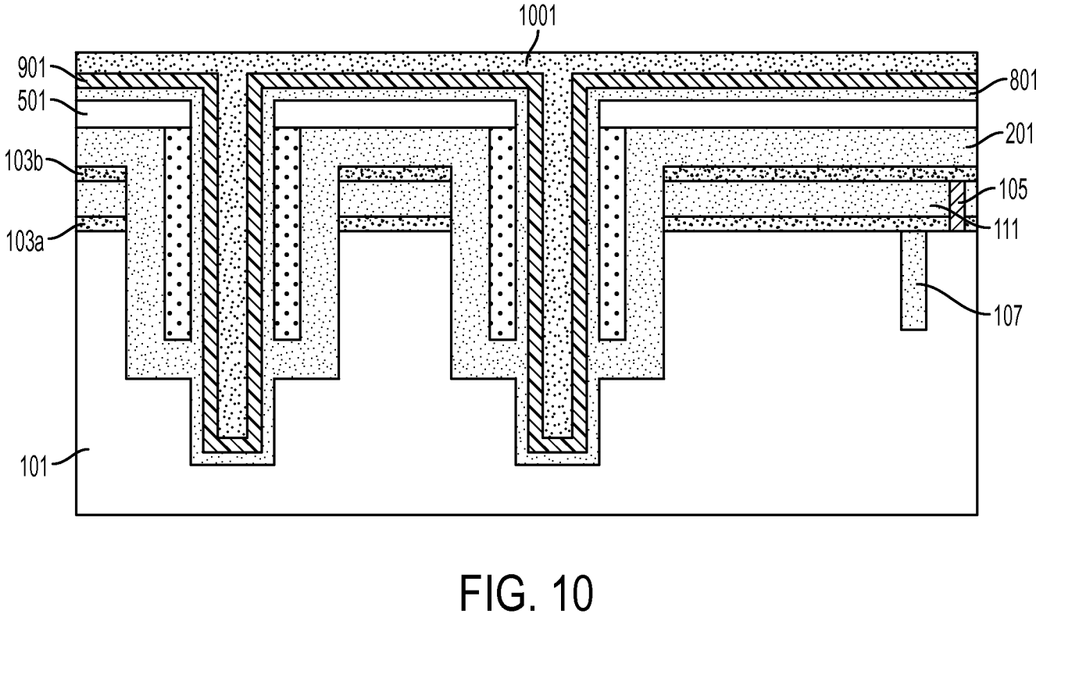

As illustrated in FIG. 10, a conductive material 1001 is formed over the substrate to fill the second cavity 701. The conductive material may be any conductive material, such as, for example, copper (Cu).

Figure 11:
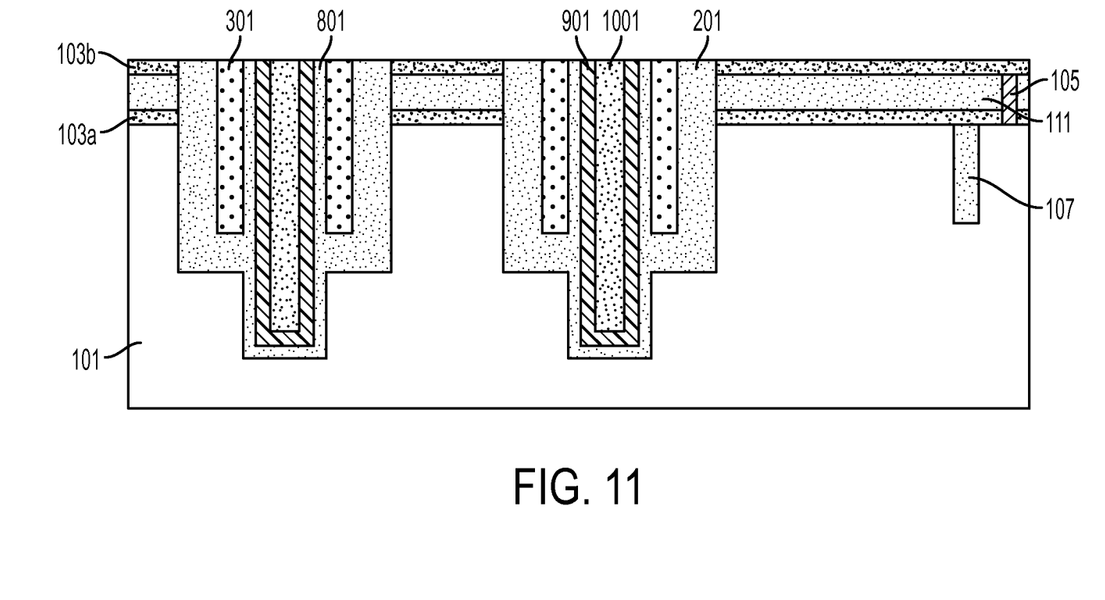
Figure 12:
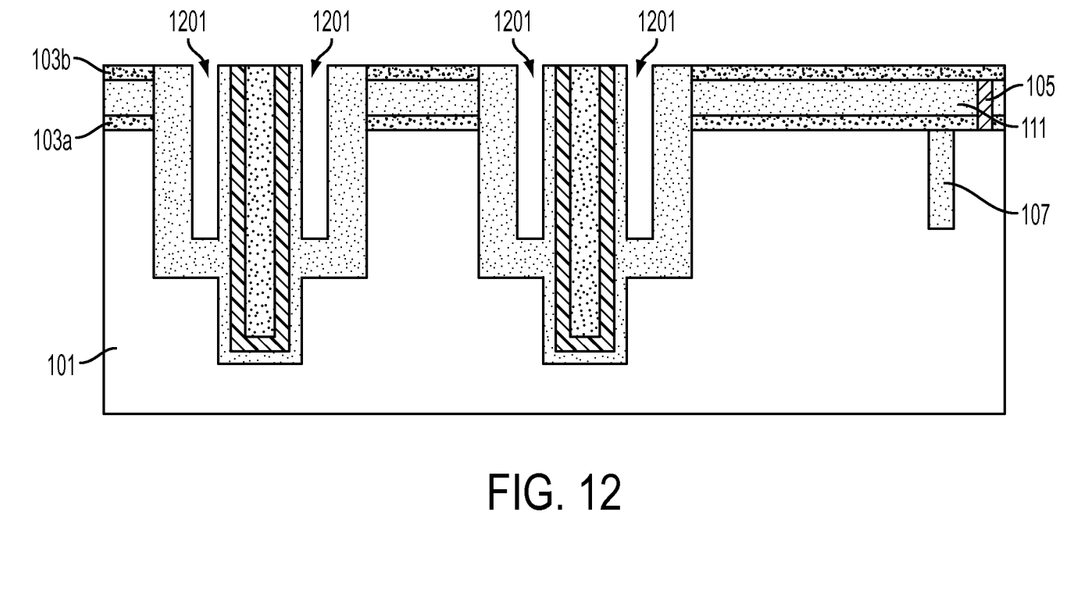

Adverting to FIG. 11, the conductive material 1001, the conductive liner 901, the oxide layer 801, the protective oxide layer 501, and the oxide layer 201 are polished down to an upper surface of the nitride layer 103b, for example by CMP. Then, the remaining portion of the sacrificial material 301 is removed forming air gaps 1201, as illustrated in FIG. 12. The sacrificial material 301 may be removed by any process, such as polymer decomposition or by etching.

Figure 13:
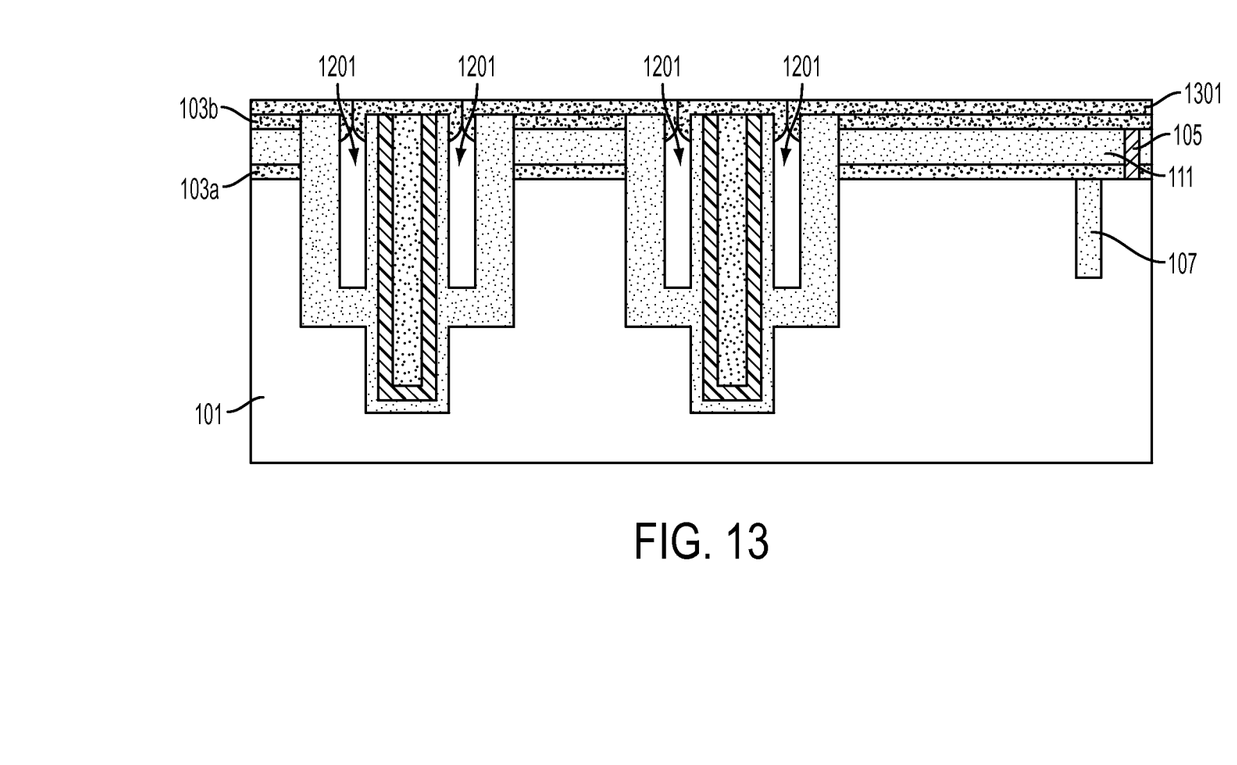

As shown in FIG. 13, a capping layer 1301 is formed over the substrate 101 and the air gaps 1201, to cap the air gaps 1201. The capping layer 1301 may be formed of any material that has poor gap filling qualities, for example silicon nitride (SiN), silicon carbide (SiC), silicon nitride carbide (SiCN), SiCOH films, or by plasma-enhanced chemical vapor deposition (PECVD) of SiCHN films and/or nitride films.

Figure 14:
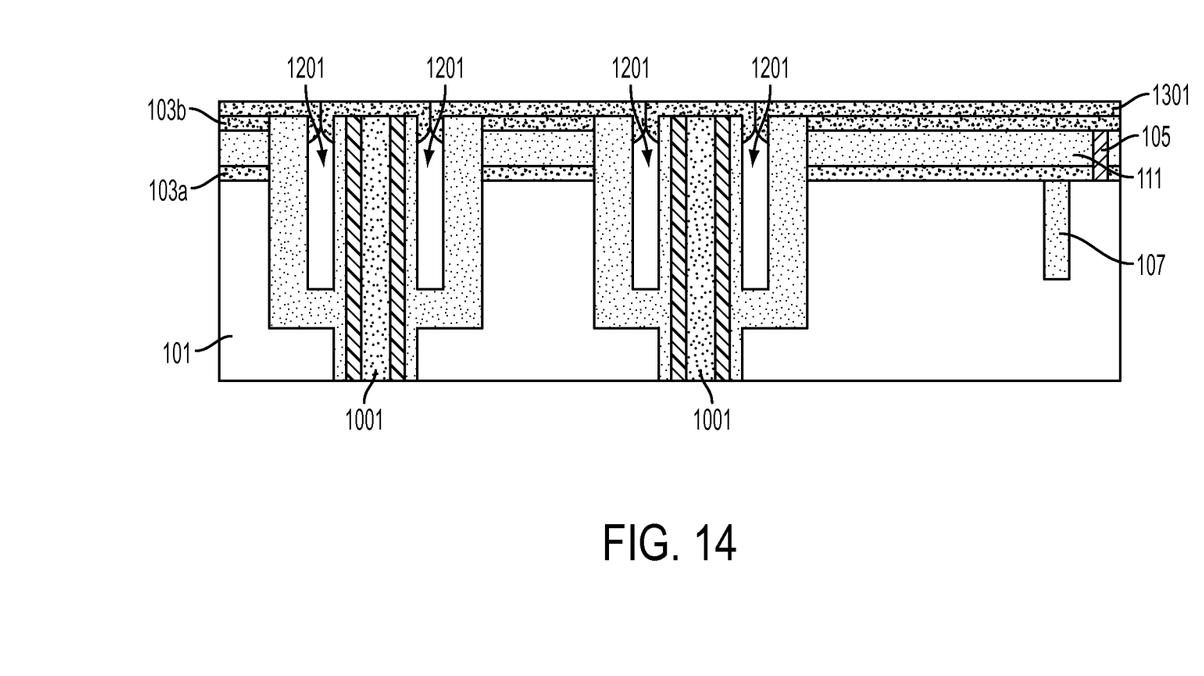

Adverting to FIG. 14, a bottom portion of the substrate 101 may be removed via, for example, CMP to expose the bottom portion of the conductive material 1001, thus forming a TSV with an air gap between the substrate 101 and the conductive material 1001.

By forming an air gap between the substrate 101 and the conductive material 1001, for example, semiconductor devices may be formed with a keep-out zone of less than 1 μm, such that transistors may be spaced apart less than 1 μm. Further, for example, a 17 nm wide air gap can protect a 5 μm TSV to withstand 400° C.

The embodiments of the present disclosure achieve several technical effects, including reducing the thermal-mechanical stress induced on through-silicon vias, reducing the distance between TSVs and device regions of semiconductor devices, and increasing semiconductor device density without degradation of semiconductor device performance. The present disclosure enjoys utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first cavity in a substrate;
   filling the first cavity with a sacrificial material;
   lining the first cavity with an oxide material prior to filling the first cavity with the sacrificial material;
   forming a second cavity in the substrate, through the sacrificial material and the oxide material, by removing a portion of the sacrificial material, a portion of the oxide material, and a portion of the substrate below the sacrificial material;
   filling the second cavity with a conductive material;
   removing a remaining portion of the sacrificial material to form an air gap between the conductive material and the substrate; and
   forming a cap over the air gap.

2. The method according to claim 1, further comprising:
   forming a photoresist over the substrate and the sacrificial material;
   patterning the photoresist; and
   removing the photoresist over the portion of the sacrificial material, prior to forming the second cavity.

3. The method according to claim 2, further comprising:
   forming a protective oxide layer over the sacrificial material prior to forming the photoresist.

4. The method according to claim 3, further comprising:
   removing the protective oxide layer prior to removing the remaining portion of the sacrificial material.

5. The method according to claim 1, further comprising:
   lining the second cavity with an oxide material prior to filling the second cavity with the conductive material, wherein the air gap is formed between the substrate and the oxide material.

6. The method according to claim 5, further comprising:
   lining the second cavity with a liner material after lining the second cavity with the oxide material and prior to filling the cavity with the conductive material.

7. The method according to 1, wherein the second cavity is formed deeper than the first cavity and the second cavity is narrower than the first cavity, further comprising removing a bottom portion of the substrate to expose the conductive material.

8. A method comprising:
   forming at least one first cavity in a substrate;
   conformally depositing an oxide material over the substrate and lining the first cavity;
   filling the oxide-lined first cavity with a polymer material;
   forming an oxide protection layer over the polymer material and the substrate;
   forming a second cavity through the oxide protection layer, the polymer material, the oxide material, and a portion of the substrate, the second cavity having a diameter smaller than a diameter of the first cavity;
   conformally depositing an isolation material followed by a conductive liner material over the substrate and lining the second cavity;
   filling the lined cavity with a conductive material;
   polishing the conductive material, the liner material, the oxide protection layer, and the oxide material down to an upper surface of the substrate;
   removing a remaining portion of the polymer material to form an air gap between the isolation material and the oxide material; and
   forming a cap over the air gap.

* * * * *